(12) United States Patent
Sammoura et al.

(10) Patent No.: US 8,267,486 B2
(45) Date of Patent: Sep. 18, 2012

(54) APPARATUS AND METHOD OF DETECTING MICROCHIP HERMETICITY

(75) Inventors: Firas Sammoura, Melrose, MA (US); Kuang Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 816 days.

(21) Appl. No.: 12/342,140

(22) Filed: Dec. 23, 2008

(65) Prior Publication Data

US 2010/0154517 A1 Jun. 24, 2010

(51) Int. Cl.
*B60T 8/88* (2006.01)

(52) U.S. Cl. .................. 303/122.05; 73/1.38; 73/29.04; 73/49.3

(58) Field of Classification Search .............. 73/49.3, 73/1.06, 1.38, 29.04, 52; 257/682; 303/122.05
See application file for complete search history.

(56) References Cited

U.S. PATENT DOCUMENTS

| | | | | |
|---|---|---|---|---|
| 4,958,851 A * | 9/1990 | Behr et al. | | 280/735 |
| 5,307,139 A * | 4/1994 | Tyson et al. | | 356/35.5 |
| 5,428,988 A * | 7/1995 | Starkovich | | 73/40 |
| 5,496,979 A * | 3/1996 | Behr | | 200/61.45 M |
| 5,872,309 A | 2/1999 | Pinter | | 73/49.3 |
| 6,305,760 B1 * | 10/2001 | Otake | | 303/122.05 |
| 6,638,784 B2 * | 10/2003 | Bartlett et al. | | 438/51 |
| 6,986,278 B2 * | 1/2006 | Schatz et al. | | 73/49.3 |
| 7,114,371 B2 * | 10/2006 | Swanson et al. | | 73/49.3 |
| 7,200,469 B2 * | 4/2007 | Katrak et al. | | 701/1 |
| 7,208,327 B2 * | 4/2007 | Gstrein et al. | | 438/10 |
| 7,572,053 B2 * | 8/2009 | De Crecy et al. | | 374/5 |
| 7,871,136 B2 * | 1/2011 | Okai | | 303/122.05 |
| 2004/0118187 A1 | 6/2004 | Chien et al. | | 73/49.3 |
| 2007/0196923 A1 | 8/2007 | Gueissaz et al. | | 436/3 |
| 2008/0054382 A1 | 3/2008 | Stetter | | |
| 2009/0153312 A1 * | 6/2009 | Tanaka et al. | | 340/426.1 |
| 2009/0289202 A1 * | 11/2009 | Yakimov et al. | | 250/473.1 |
| 2009/0294879 A1 * | 12/2009 | Bhagavat et al. | | 257/415 |

FOREIGN PATENT DOCUMENTS

WO   WO 2008/082362   7/2008

OTHER PUBLICATIONS

Sosnowchik, B.D., Jong-Yoon Ha, Liwei Lin, "Titanium-based nanoswords: Synthesis and characterization," Nano/Micro Engineered and Molecular Systems, 2008. NEMS 2008. 3rd IEEE International Conference on, pp. 1005-1010, Jan. 6-9, 2008.*

(Continued)

*Primary Examiner* — Lisa Caputo
*Assistant Examiner* — Punam Roy
(74) *Attorney, Agent, or Firm* — Sunstein Kann Murphy & Timbers LLP

(57) ABSTRACT

A microchip system has a package forming a hermetically sealed interior, and MEMS structure within the interior. The system also has a gas sensor for detecting the concentration of at least one of oxygen or hydrogen within the interior.

16 Claims, 6 Drawing Sheets

OTHER PUBLICATIONS

Xu, Chao-Nan et al., *Humidity sensors using manganese oxides*, Elsevier Science S.A., vol. 46, pp. 87-96, 1998.

Baselt, D.R. et al., *Design and performance of a microcantilever-based hyudrogen sensor*, Elsevier Science S.A., vol. 88, pp. 120-131, 2003.

Ueda, Y. et al., *Hydrogen gas sensor using nano-sized R-MnO$_2$ powder*, ECS Transactions, vol. 16, pp. 287-292, 2008.

Ueda, Y. et al., *Hydrogen gas sensor using nano-sized R-MnO$_2$ powder*, Kyoto University, 1 page, 2008.

International Searching Authority, International Search Report—International Application No. PCT/US2009/066514, dated Feb. 25, 2011, together with the Written Opinion of the International Searching Authority, 11 pages.

* cited by examiner

APPARATUS AND METHOD OF DETECTING MICROCHIP HERMETICITY

FIELD OF THE INVENTION

The invention generally relates to packaged microchips and, more particularly, the invention relates to detecting hermeticity in packaged microchips.

BACKGROUND OF THE INVENTION

Many types of microchips, such as MEMS accelerometers, can malfunction if exposed to the environment. For example, if exposed to the environment, moisture and debris may settle between a suspended mass and substrate of a conventional accelerometer. As a result, the mass may stick to the substrate, thus causing the accelerometer to provide no output signal indicative of actual acceleration. This can present a very dangerous situation when used as part of a safety device, such as an automobile airbag system.

The art responded to this problem by often hermetically sealing environmentally sensitive components within a microchip package. For example, an accelerometer die may have either a cap over the sensitive microstructure (effectively forming a wafer level package), or a separate package completely containing the entire die. In either case, the package hermetically seals the sensitive microstructure within the package interior, protecting it from the environment.

During use, however, some packages undesirably may lose their hermeticity.

SUMMARY OF THE INVENTION

In accordance with one embodiment of the invention, a microchip system has a package forming a hermetically sealed interior, and MEMS structure within the interior. The system also has a gas sensor for detecting the concentration of at least one of oxygen or hydrogen within the interior.

The package may be any type, such as a wafer level or package level package. For example, the package may include a MEMS die having the MEMS structure, and a cap secured to the MEMS die—the MEMS die and cap thus form the interior. Alternatively, the package may have a base supporting a MEMS die containing the MEMS structure, and a lid sealed to the base.

Various embodiments use a number of different types of gas sensors. Specifically, the gas sensor may include a metal oxide. For example, the gas sensor may be formed at least in part from a metal oxide film or a metal oxide nanotube. The system also may have a signal detector electrically coupled with the gas sensor. The signal detector is configured 1) to receive an electric signal from the gas sensor, and 2) to determine if the package has lost hermeticity based upon characteristics of the electric signal.

In accordance with another embodiment of the invention, a microchip system has a package forming a hermetically sealed interior, and a gas sensor within the interior for detecting the concentration of at least one of oxygen or hydrogen. The gas sensor is capable of delivering a signal having information indicating if the interior maintains hermeticity.

In this and related embodiments, the microchip system may have a functional element within the interior. For example, the functional element may include MEMS structure and/or an inertial sensor.

Among other things, the gas sensor may be formed from at least one of titanium based oxide and a manganese based oxide. In addition to the gas sensor within the interior, the system also may have a control gas sensor exterior to the package. Moreover, the system also may have at least one of visual and audible indicia indicating if the interior maintains hermeticity.

In accordance with other embodiments of the invention, a microchip hermeticity method provides a microchip having a package that forms an interior, monitors the concentration of at least one of oxygen or hydrogen within the interior, and generates a status signal indicating whether the package interior is hermetically sealed.

To generate the status signal, some embodiments forward a drive signal to a gas detector within the interior of the package. The status signal is a function of the drive signal. While monitoring, some embodiments may detect an increase in oxygen concentration within the interior, a decrease in hydrogen concentration, or some other change in gas concentration.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a packaged microchip has a gas sensor that plays a primary role in determining the whether the interior of a microchip has maintained its hermeticity. To that end, the sensor may detect the level of oxygen or hydrogen within the interior of the package, and generate a warning signal when oxygen or hydrogen levels exceed a prespecified threshold indicative of a hermeticity loss or degradation. Details of various embodiments are discussed below.

Figure 1A:
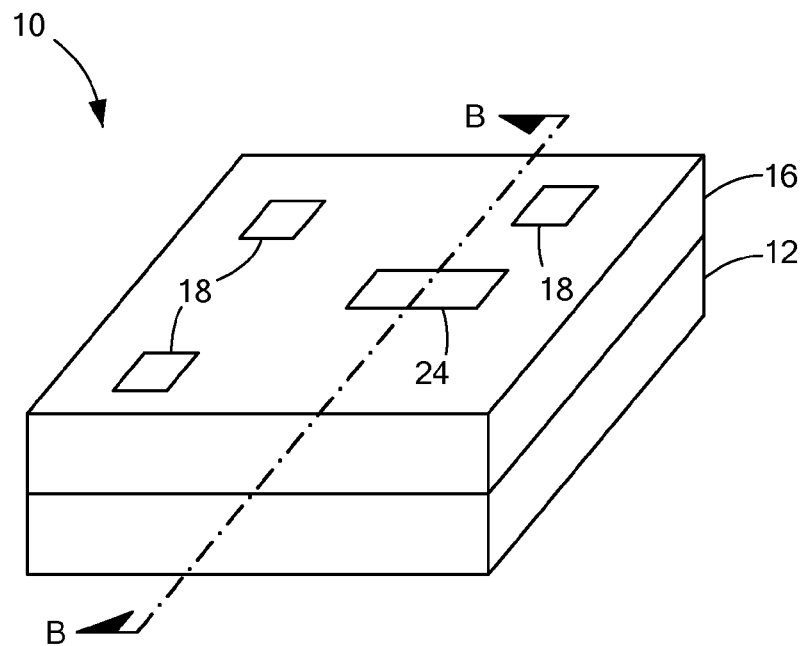
FIG. 1A schematically shows a perspective view of a capped microchip configured in accordance with illustrative embodiments of the invention.

FIG. 1A schematically shows a perspective view of a capped microchip 10 (also referred to as a "capped die") configured in accordance with illustrative embodiments of the invention. As discussed in greater detail below, the capped microchip 10 has a die 12 containing some functional element(s) 14 (FIG. 1B, discussed below), and a cap 16 forming a hermetically sealed interior 17 (also shown in FIG. 1B) for protecting the functional element(s) 14 on the die 12. A plurality of contacts 18 provide electrical contact to the functional element(s) 14 and other components.

Among other things, the functional element(s) 14 on the die 12 may include microelectromechanical systems (known as "MEMS"), circuitry, or both. For example, the die 12 may implement an inertial sensor, such as an accelerometer or gyroscope. To that end, the die 12 may have movable mass microstructure(s) (not shown in detail) suspended above a substrate, and interdigitated fingers (not shown) for detecting movement. In addition, the die 12 also may have on-board circuitry (not shown) that cooperates with the MEMS structure, such as IMEMS sensors distributed by Analog Devices, Inc. of Norwood, Mass.

Alternatively, the die 12 may have MEMS microstructure only, or circuitry only. In addition, the MEMS device may implement any of a number of other or different functions, such as those of a microphone, pressure sensor, optical switch, or other known MEMS device. Accordingly, discussion of the above noted specific examples is for discussion purposes only and thus, not intended to limit all embodiments of the invention.

Figure 1B:
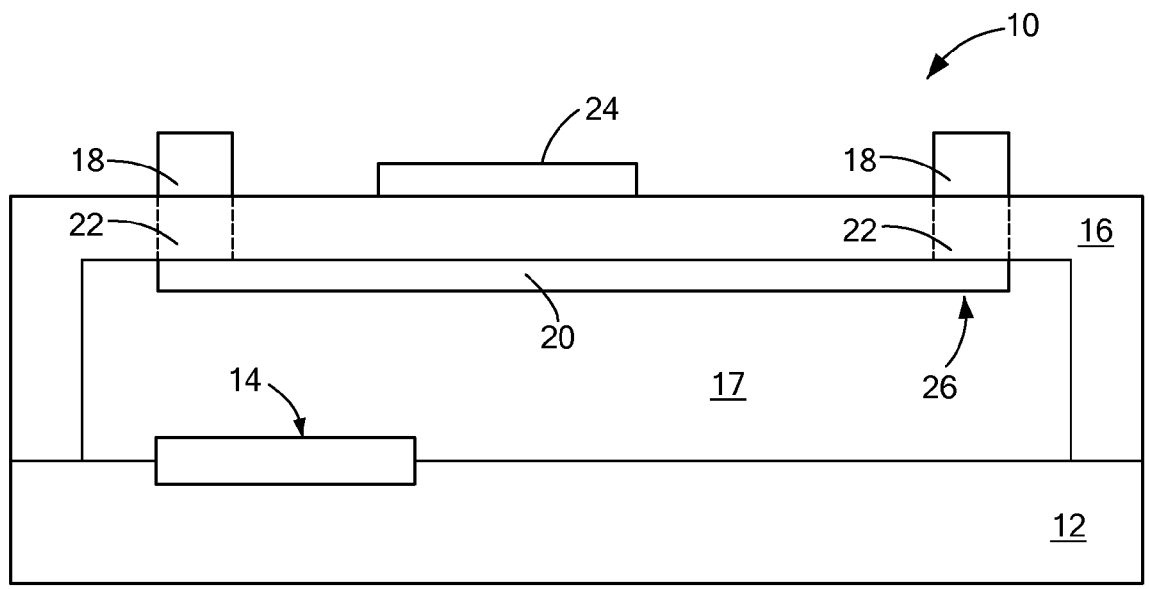
FIG. 1B schematically shows a cross-sectional view of the capped microchip shown in FIG. 1A.

In addition to protecting the functional elements of the die 12, the capped microchip 10 also has significant built-in functionality. Specifically, in accordance with illustrative embodiments of the invention, the cap 16 has a sensor and contact system for monitoring hermeticity within the interior 17 of the capped microchip 10. To that end, FIG. 1B schematically shows a cross-sectional view of the capped microchip 10 shown in FIG. 1A. As shown, the capped microchip 10 has the above noted MEMS structure within the interior 17, and the above noted sensor and contact system integrated into the cap 16.

The implementation shown in FIG. 1B, for example, has an interior gas sensor 20 electrically connected, through vias 22, to at least two external contacts 18 on the exterior surface of the cap 16. The cap exterior surface of also has a corresponding reference gas sensor 24 that acts as a reference for gas readings made by the interior gas sensor 20. Details of the interaction of the two gas sensors 20 and 24 is discussed in greater detail below with reference to FIG. 7. The reference gas sensor 24 is optional, but, in many implementations, can provide improved accuracy. Accordingly, some embodiments include only one or more interior gas sensors 20.

The gas sensors 20 and 24 may be formed using any of a number of different technologies suitable for a given application. In illustrative embodiments, the gas sensors 20 and 24 are formed as metal oxide films that have a high sensitivity and fast response to oxygen and/or hydrogen concentrations. For example, the sensors 20 and 24 may be formed from a titanium dioxide, which is an extrinsic n-type semiconductor having a conductivity that is modulated by oxygen concentration. Specifically, as known by those skilled in the art, titanium dioxide is normally oxygen deficient when nonstochiometric.

To ensure a change in oxygen concentration if hermeticity deteriorates, illustrative embodiments form the interior of each capped microchip 10 to be substantially oxygen deficient, or to have a substantially reduced oxygen concentration. Accordingly, if the hermetic seal around the edge of the cap 16 begins to deteriorate appreciably, oxygen from the environment should leak into the interior 17. This increase in oxygen concentration consequently changes the conductivity of the titanium dioxide sensor 20. External systems therefore simply may apply a voltage or current across the interior sensor 20 to detect this conductivity change and thus, identify the degradation or loss of hermeticity. As noted above, see the discussion below with regard to FIG. 7 for additional information on detection processes.

To detect a change in hydrogen concentration, other embodiments may implement the sensors 20 and 24 as a manganese dioxide film. Accordingly, in a manner similar to embodiments using titanium dioxide, such embodiments form the interior of each capped microchip 10 to be substantially hydrogen deficient, or to have a substantially reduced hydrogen concentration. A degradation in hermeticity therefore may be detected by a rise in hydrogen concentration within the interior 17.

Of course, the inventors contemplate that other films, other implementations, or different gas sensors should suffice. For example, sensors formed from nanowires, nanoswords, or nanotubes may provide satisfactory results. Accordingly, discussion of specific sensor technologies is exemplary only and thus, not intended to limit all embodiments of invention.

Figure 2:
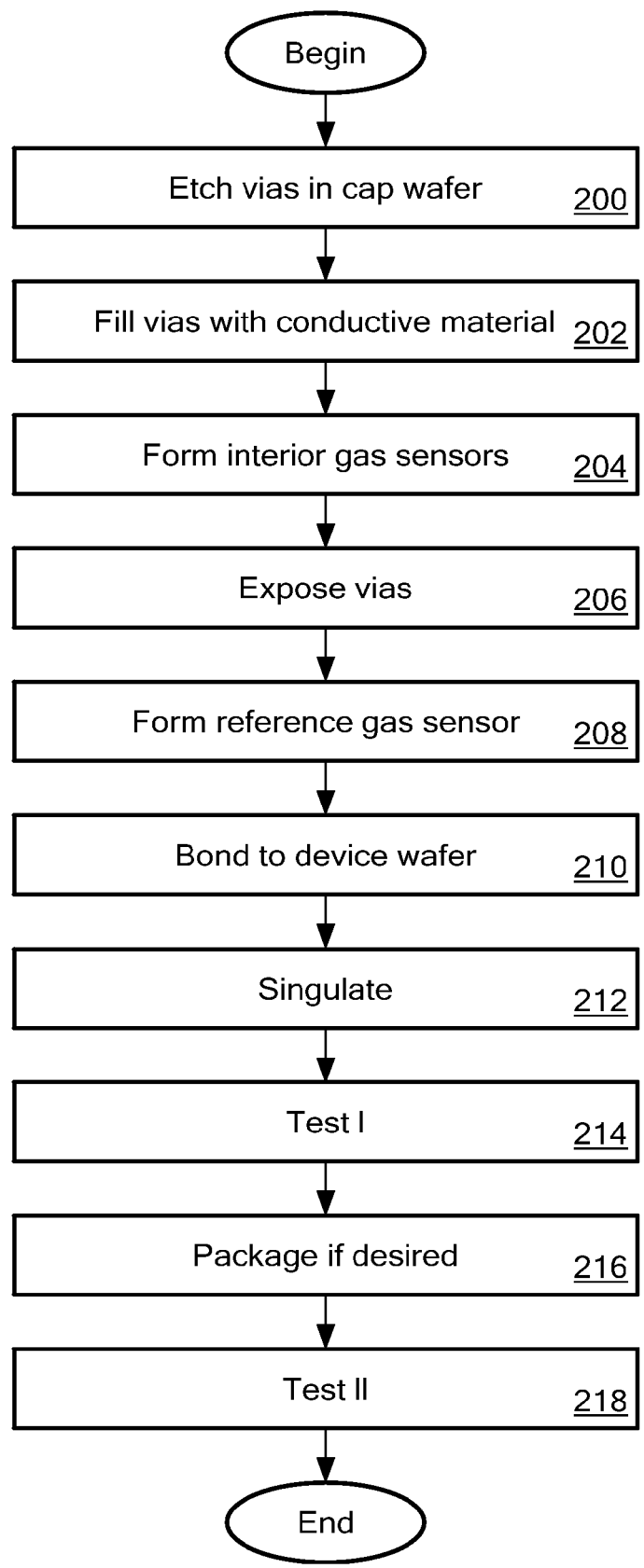
FIG. 2 shows a process of forming and packaging the capped microchip shown in FIG. 1A in accordance with illustrative embodiments of the invention.

FIG. 2 shows an process of forming and packaging the capped microchip 10 shown in FIG. 1A in accordance with illustrative embodiments of the invention. Although this process discusses various important steps in forming the capped microchip 10, it may omit some steps for simplicity purposes. In addition, those skilled in the art may perform various steps a different order of that shown.

As is common in the art, conventional techniques process a single wafer to form the desired structure; namely, in this case, a two-dimensional array of caps 16. Each cap 16 corresponds with a single device on a two-dimensional array of devices (e.g., MEMS devices and circuitry as discussed above) on a device wafer.

Figure 3A:
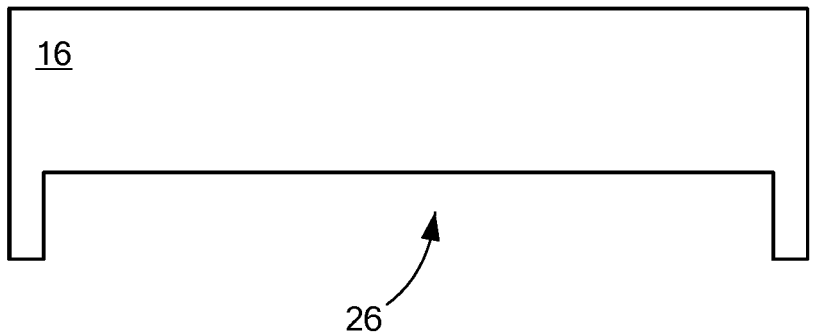
FIGS. 3A-3G schematically show cross-sectional views of the progression of a cap fabricated by the process of FIG. 2.
Figure 3B:
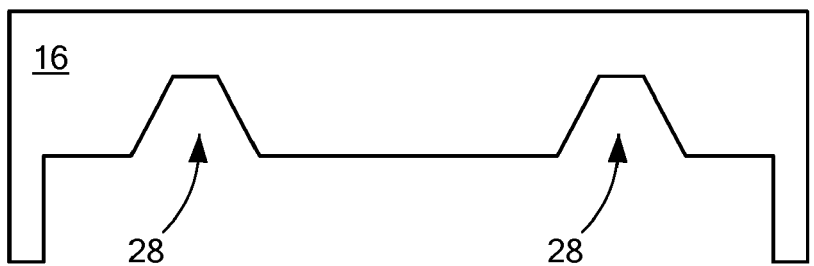

As an example, FIGS. 3A-3G shows one of those caps as the process of FIG. 2 forms the desired sensor system. FIG. 3A thus shows the cap 16 before significant processing (it only has a cavity 26), while FIG. 3B shows the cap 16 after step 200 forms via channels 28.

More specifically, the process begins at step 200, which etches the noted via channels 28 in a cap wafer. Any of a number of different etching technologies, such as a dry etch or a wet etch, should suffice for this step.

Figure 3C:
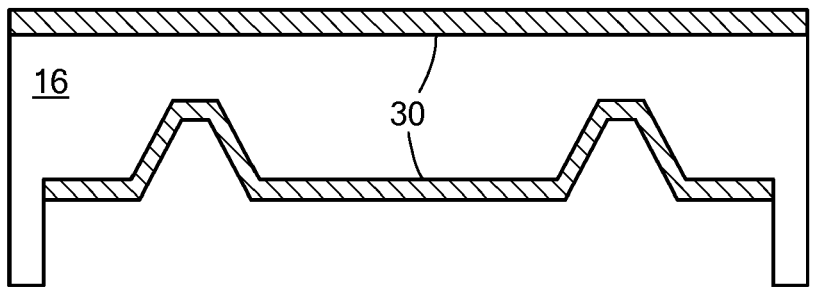
Figure 3D:
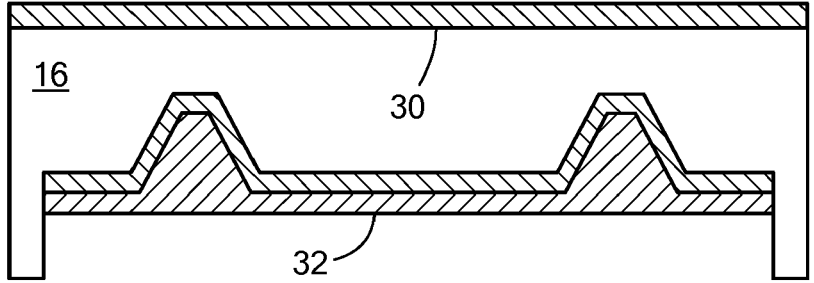
Figure 3E:
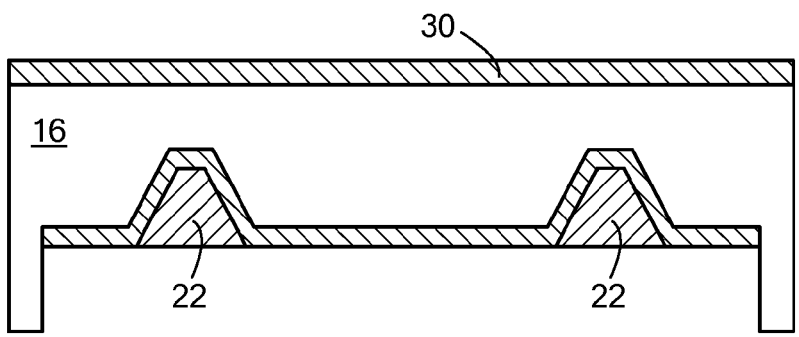

After forming the via channels 28, the process continues to step 202 by filling via channels 28 with a conductive material 32. To provide their function, however, the process first must electrically isolate the vias 22 from the remainder of the cap 16. Accordingly, as shown in FIG. 3C, the process oxidizes the via channels 28. In addition, the process also oxidizes both the top and bottom surfaces of the cap 16 (forming oxide layers 30) in anticipation of the subsequent steps. After electrically isolating the via channels 28, the process then can complete step 202 by filling the via channels 28 with a conductive material 32, such as copper.

Figure 3F:
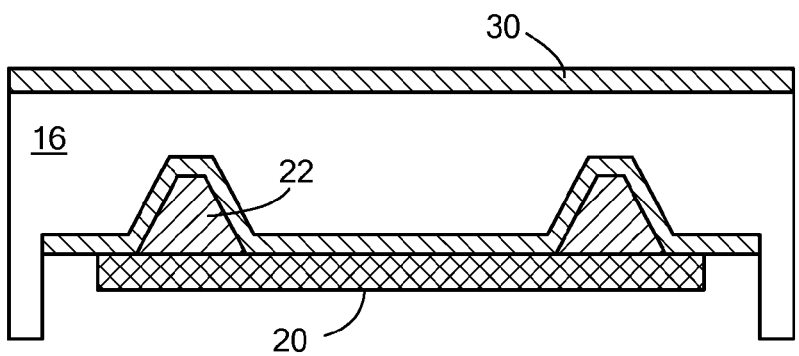
Figure 3G:
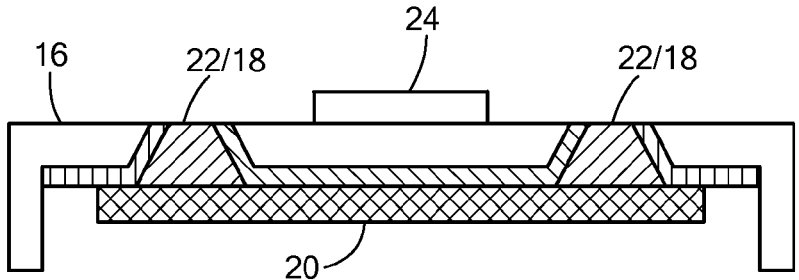

The process continues to step 204, which forms the interior gas sensor 20 on the interior facing surface of the cap wafer. To that end, step 204 first removes much of the copper remaining on the interior surface of the cap 16 (FIG. 3E), thus exposing the vias 22 to the interior of the cap. For example, conventional chemical mechanical polishing techniques may remove the copper layer, but maintain exposed the oxide layer 30. Next, step 204 deposits and fabricates the interior sensor 20 in a conventional manner on the oxide layer 30 (FIG. 3F). As shown, the interior sensor 20 both mechanically and electrically contacts the conductive material 32 forming the vias 22.

Next, the process removes much of the top surface to expose the vias 22 (step 206). This step therefore effectively forms the contacts 18 and top, exterior surface of the cap 16. After exposing the vias 22, the process forms the reference gas sensors 24 on the top surface of the cap wafer (step 208, FIG. 3G). Although not shown in the figures, an insulation layer, trench or other apparatus effectively isolates the reference gas sensors 24 from the remainder of the cap 16.

Conventional processes then may bond the cap wafer to the device wafer (step 210). For example, a glass frit or other bonding material may be deposited around each individual device on the device wafer in a manner that, when bonded, is intended to form a hermetic seal between each individual device die 12 and cap 16.

At least up to this step (or at least step 210), much of the process was performed within a gas controlled environment to control the oxygen or hydrogen concentration within the interior 17 of the capped microchip 10. For example, when using oxygen sensors, the process may be performed in a vacuum, or in a chamber having 95 percent nitrogen and 5 percent hydrogen. If using a vacuum environment, then it is anticipated that, during normal use, the concentration of oxygen should rise from about 0 percent to about 20 percent upon loss of hermeticity. In a similar manner, if using the above noted nitrogen and hydrogen environment, then, during normal use, the oxygen concentration is anticipated to rise from about 1 percent to about 20 percent upon loss of hermeticity. Those skilled in the art can determine other appropriate environments for other oxygen sensors, or hydrogen sensors.

The process then singulates the devices into individual capped microchips 10 as shown in FIG. 1A (step 212). For example, a laser dicing or diamond pointed saw may dice the coupled wafers into multiple individual packaged microchips 10.

It may be convenient to conduct a hermeticity test at this point in the process. Accordingly, the process may apply a current or voltage across the noted sensors 20 and 24 (discussed below with reference to FIG. 7) to determine the hermeticity of the package interior 17 (step 214).

Figure 4:
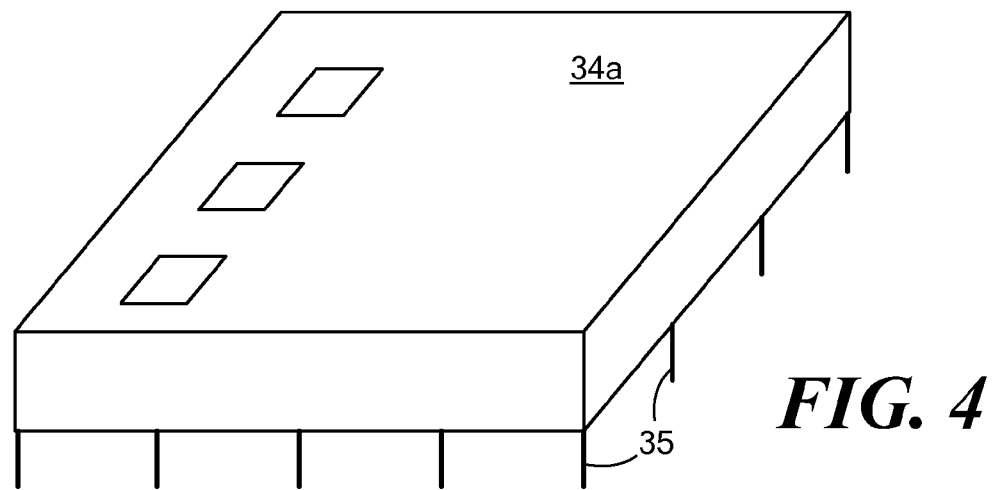
FIG. 4 schematically shows a perspective view of a packaged microchip incorporating illustrative embodiments of the invention.

As known by those skilled in the art, some capped device dies do not require additional packaging. There are instances, however, when additional packaging may be desirable. Accordingly, step 216 packages each capped microchip 10 within a package 34A. Among other types, the package 34A may include a lead frame based pre-molded or post-molded package, a ceramic package, a carrier package, or other technology. FIG. 4 schematically shows a generalized, perspective view of one such package 34A having a plurality of interface pins 35.

It may be convenient and prudent to conduct an additional hermeticity test after packaging the capped microchip 10. Accordingly, in a manner similar to that of step 214, step 218 again may test the hermeticity of the package 34A before shipment for integration into a larger system (e.g., within an airbag deployment system of an automobile).

It should be noted that the above discussion of the specific location of the gas sensors 20 and 24 is for illustrative purposes only. For example, the interior gas sensor 20 may be formed on the device die 12, or on the side walls of the cap 16. In addition, the interior 17 of the capped microchip 10 may have multiple interior gas sensors 20 for detecting different gases. For example, the interior 17 may have an interior hydrogen gas sensor 20 and an interior oxygen gas sensor 20. Other embodiments may have multiple redundant interior gas sensors 20. For example, the interior 17 may have a plurality of interior oxygen sensors 20. Still other embodiments may have multiple reference gas sensors 24.

The embodiments described above form the gas sensors 20 and 24 at the wafer level. Accordingly, as known by those skilled in the art, the capped microchips 10 may be considered to form a wafer-level, chip-scale package. If packaged within a package-level package (e.g., a leadframe package), then both of the wafer-level, chip-scale package and package-level package form the overall package for the device die 12.

Figure 5:
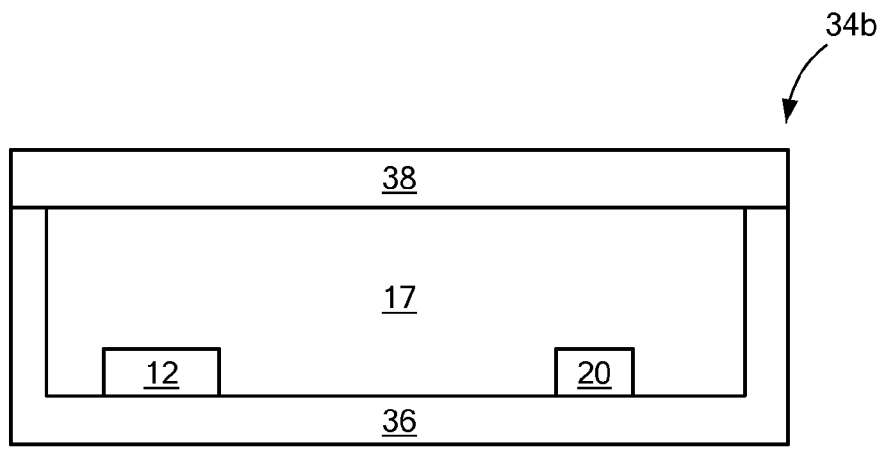
FIG. 5 schematically shows a cross-sectional view of a chip having a package-level package and incorporating illustrative embodiments of the invention.

The inventor also contemplates use of the described gas sensing technology within package level packages. Such embodiments may eliminate the need to cap the device dies 12, or provide additional hermetic testing redundancy. FIG. 5 schematically shows a cross-sectional view of a package-level package 34B having a base 36 forming a cavity that contains a device die 12 (either capped or not capped) and an interior gas sensor 20. A lid 38 seals the cavity to form a hermetically sealed interior 17. Although not shown in the figure, this packaged microchip 10 may have similar components to those of the capped microchip 10, such as a reference sensor 24 and vias 22.

Figure 6:
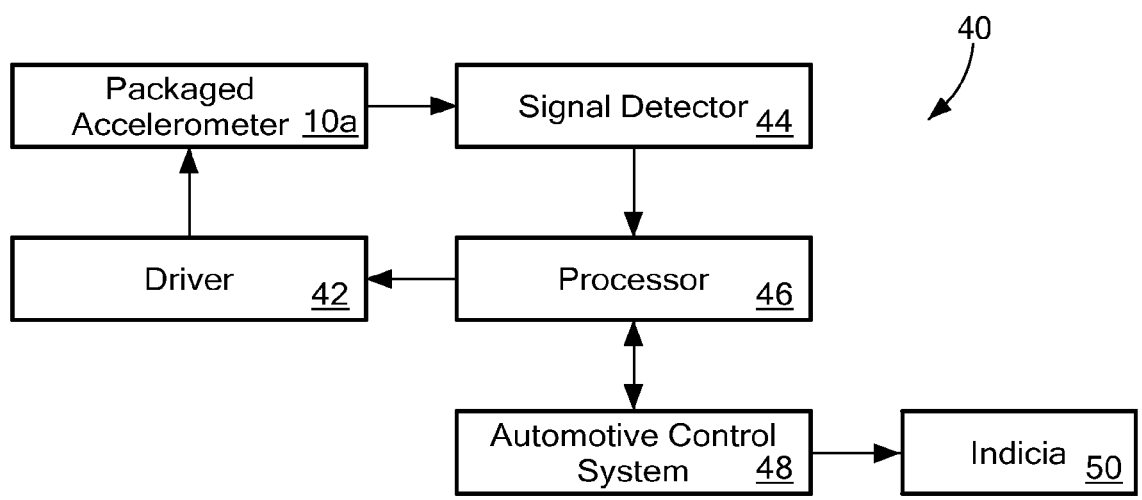
FIG. 6 schematically shows a system for determining the hermeticity of a packaged microchip in accordance with illustrative embodiments of the invention.
Figure 7:
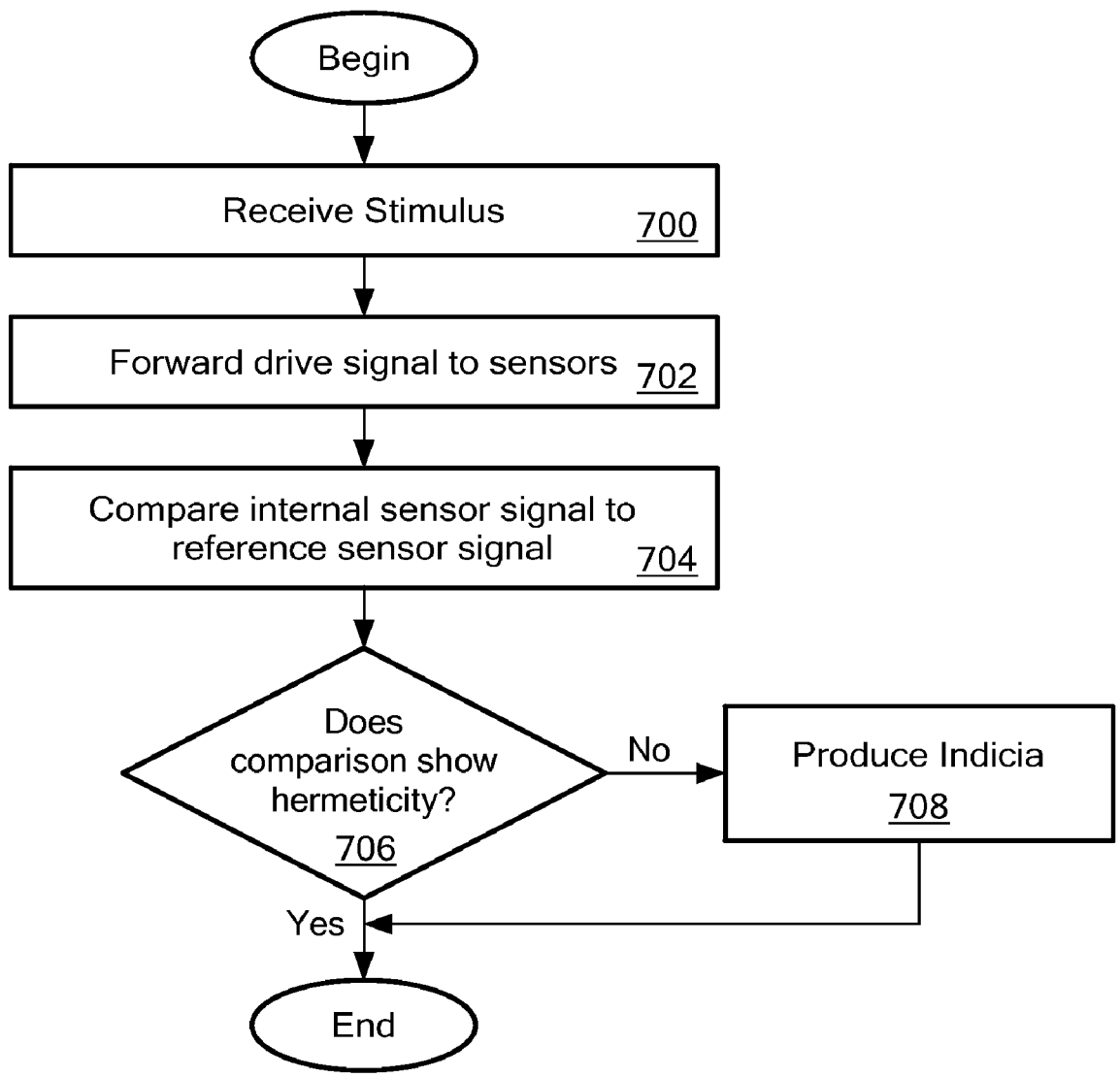
FIG. 7 shows a process of testing the hermeticity of a packaged microchip in accordance with illustrative embodiments of the invention.

FIG. 6 schematically shows an apparatus 40 for determining the hermeticity of a packaged/capped microchip 10 (an accelerometer 10A in this example) in accordance with illustrative embodiments of the invention. FIG. 7 describes operation of the apparatus 40. Specifically, the apparatus 40 of FIG. 6 has a packaged accelerometer 10A that is intended to remain hermetic. In this example, the accelerometer 10A is part of an air-bag deployment system within an automobile.

As noted above, the apparatus 40 monitors the hermetic seal of the accelerometer 10A, and reports any degradation to a monitor or other device. To that end, the apparatus 40 has a driver 42 for driving the gas sensors 20 and 24, and a signal detector 44 for detecting the output of the gas sensors 20 and 24 when driven by the driver 42. The output of the sensors 20 and 24 thus is a function of the driver signal.

The signal detector 44 forwards the output of the gas sensors 20 and 24 to a processor 46 that determines if the gas sensors 20 and 24 together have detected a change in oxygen or hydrogen concentration. If that change exceeds a prescribed threshold, then the processor 46 may forward a trouble signal, through an automotive control system 48, to produce some indicia 50 in the automobile. Operation of this apparatus 40 is discussed in more detail with reference to FIG. 7.

Specifically, FIG. 7 shows a process of testing the hermeticity of a packaged microchip 10/34A/34B in accordance with illustrative embodiments of the invention. In a manner similar to the process of FIG. 2, this process also may omit certain steps, or be performed in a different order. Moreover, those skilled in the art can modify this process or use other processes in accordance with illustrative embodiments. Discussion of this specific implementation, which is in the context of an accelerometer within an automobile, is intended simply to be an example of one use of various embodiments.

The process begins at step 700, in which the processor 46 receives a test stimulus signal from the automotive control system 48. For example, this test stimulus signal could be generated whenever the car is started, or when an automotive technician injects a test signal directly into the automotive system 48. In response, the processor 46 causes the driver 42 to generate and forward a drive signal to the gas sensors 20 and 24 in the accelerometer 10A (step 702). This drive signal can be a simple DC current or voltage signal across both of the gas sensors 20 and 24.

The signal detector 44 then forwards the output of the interior gas sensor 20 and reference gas sensor 24 to the processor 46 for analysis (step 704). One important function of the reference gas sensor 24 is to compensate for parameters that can change the resistance of the interior gas sensor 20. For example, the temperature may cause a change in resistance to the interior gas sensor 20, which, if not detected, could give false positives or negatives. The reference sensor 24 thus should respond in corresponding manner to the interior sensor 20, consequently effectively eliminating such variables.

Accordingly, in this example, the processor 46 may calculate the difference between the reference sensor signal and the internal sensor signal. Alternatively, the signal detector 44 may incorporate the functionality of the processor 46 to make this determination.

The process then determines at step 706 if, as a result of this comparison, the package has maintained hermeticity. Continuing with the above example, if the processor 46 determines that the difference between the reference sensor signal in the internal sensor signal is below a certain threshold, then it considers the accelerometer 10A to have lost hermeticity. In that case, the process continues to step 708, which produces some indicia 50. For example, processor 46 may generate an indicia signal that causes the automobile to display a trouble light in its dashboard. Alternatively, the apparatus 40 may produce an audible signal indicating a loss of hermeticity.

It should be reiterated that the process of FIG. 7 is one of many ways of testing a packaged microchip 10/34A/34B configured in accordance with illustrative embodiments. As noted above with regard to FIG. 2, for example, a test engineer within a semiconductor fabrication plant may have specialized equipment, or similar equipment to that shown in FIG. 6, for testing the packaged microchip.

Accordingly, illustrative embodiments readily determine the hermeticity of a packaged microchip in an efficient manner. Although the above discussion discloses various exemplary embodiments of the invention, it should be apparent that those skilled in the art can make various modifications that will achieve some of the advantages of the invention without departing from the true scope of the invention.

What is claimed is:

1. A microchip system comprising:
    a package forming a hermetically sealed interior;
    MEMS structure within the interior;
    a gas sensor within the interior for detecting the concentration of at least one of oxygen and hydrogen within the interior;
    a reference gas sensor exterior to the package; and
    a signal detector electrically coupled with the gas sensor and the reference gas sensor, the signal detector being configured to receive an electric signal from the gas sensor and to receive an electric signal from the reference gas sensor, the signal detector also being configured to determine if the package has lost hermeticity based upon characteristics of the electric signals from both the gas sensor and the reference gas sensor and produce indicia indicating whether the package interior is hermetically sealed, wherein the indicia comprises a light within a motor vehicle.

2. The microchip system as defined by claim 1 wherein the package comprises a MEMS die having the MEMS structure, and a cap secured to the MEMS die, the MEMS die and cap forming the interior.

3. The microchip system as defined by claim 1 wherein the package comprises a base supporting a MEMS die, and a lid sealed to the base, the MEMS die containing the MEMS structure.

4. The microchip system as defined by claim 1 wherein the gas sensor comprises a metal oxide.

5. The microchip system as defined by claim 4 wherein the gas sensor comprises a metal oxide film.

6. The microchip system as defined by claim 4 wherein the gas sensor comprises a metal oxide nanotube.

7. A microchip system comprising:
    a package forming a hermetically sealed interior;
    a gas sensor within the interior for detecting the concentration of at least one of oxygen and hydrogen, the gas sensor being capable of delivering a signal having information indicating if the interior maintains hermeticity;
    a reference gas sensor exterior to the package; and
    a signal detector electrically coupled with the gas sensor and the reference gas sensor, the signal detector being configured to receive the signal from the gas sensor and to receive a signal from the reference gas sensor, the signal detector also being configured to determine if the package has lost hermeticity based upon characteristics of the signals from both the gas sensor and the reference gas sensor and produce indicia indicating whether the package interior is hermetically sealed, wherein the indicia comprises a light within a motor vehicle.

8. The microchip system as defined by claim 7 further comprising a functional element within the interior.

9. The microchip system as defined by claim 8 wherein the functional element comprises MEMS structure.

10. The microchip system as defined by claim 9 wherein the MEMS structure comprises an inertial sensor.

11. The microchip system as defined by claim 7 wherein the gas sensor comprises titanium based oxide.

12. The microchip system as defined by claim 7 further comprising at least one of visual and audible indicia indicating if the interior maintains hermeticity.

13. A microchip hermeticity method comprising:
    providing a microchip having a package that forms an interior;
    monitoring the concentration of at least one of oxygen and hydrogen within the interior;
    generating a status signal indicating whether the package interior is hermetically sealed based on the monitored concentration and a reference signal received from a reference gas sensor exterior to the package; and
    producing indicia indicating whether the package interior is hermetically sealed, producing being a function of the status signal, wherein the indicia comprises a light within a motor vehicle.

14. The method as defined by claim 13 wherein generating comprises:
    forwarding a drive signal to a gas detector within the interior of the package, the status signal being a function of the drive signal.

15. The method as defined by claim 13 wherein the microchip comprises MEMS structure within the interior.

16. The method as defined by claim 13 wherein monitoring comprises detecting an increase in oxygen concentration within the interior.

* * * * *